(12) United States Patent
Hitchcock

(10) Patent No.: US 7,122,999 B1
(45) Date of Patent: Oct. 17, 2006

(54) CIRCUIT FOR COMPENSATING RISE TIMES AND RINGING IN HIGH IMPEDANCE LOADS

(75) Inventor: Roger Hitchcock, San Leandro, CA (US)

(73) Assignee: Stangenes Industries, Inc., Palo Alto, CA (US)

( * ) Notice: Subject to any disclaimer, the term of this patent is extended or adjusted under 35 U.S.C. 154(b) by 297 days.

(21) Appl. No.: 10/784,755

(22) Filed: Feb. 23, 2004

(51) Int. Cl.
*H01F 27/42* (2006.01)
*H01F 17/00* (2006.01)
*H02M 7/10* (2006.01)

(52) U.S. Cl. ..................... 323/356; 323/355
(58) Field of Classification Search .......... 323/355, 323/356, 359, 361; 336/155, 182, 184, 220
See application file for complete search history.

(56) References Cited

U.S. PATENT DOCUMENTS

| | | | |
|---|---|---|---|
| 3,866,107 A * | 2/1975 | Shaw | ............ 363/49 |
| 4,005,314 A | 1/1977 | Zinn | |
| 4,255,668 A | 3/1981 | Harrison | |
| 4,272,692 A | 6/1981 | Morse | |
| 4,275,317 A | 6/1981 | Laundenslager et al. | |
| 4,442,362 A | 4/1984 | Rao | |
| 4,684,820 A | 8/1987 | Valencia | |
| 5,089,727 A | 2/1992 | Molitor et al. | |
| 5,495,209 A | 2/1996 | Gerstenberg | |
| 5,621,255 A | 4/1997 | Leon et al. | |
| 5,900,681 A | 5/1999 | Johansson et al. | |
| 6,185,114 B1 * | 2/2001 | Matsumoto et al. | ...... 363/21.06 |
| 6,329,803 B1 * | 12/2001 | Hitchcock | ............ 323/288 |
| 6,355,992 B1 | 3/2002 | Via | |
| 6,633,093 B1 | 10/2003 | Rim et al. | |
| 6,831,847 B1 * | 12/2004 | Perry | ............ 363/21.06 |

FOREIGN PATENT DOCUMENTS

| | | |
|---|---|---|
| JP | 2002/000277282 | 6/2001 |
| RU | 1999/000118119 | 5/2001 |
| WO | WO99/60679 | 11/1999 |

* cited by examiner

*Primary Examiner*—Matthew V. Nguyen
(74) *Attorney, Agent, or Firm*—Workman Nydegger

(57) ABSTRACT

Circuits for shortening a rise time of a load include a main pulse transformer coupled to a load, an auxiliary pulse transformer coupled to the load, and a diode connected between the auxiliary pulse transformer and the main pulse transformer. The main pulse transformer delivers a main pulse to the load. The auxiliary pulse transformer delivers an auxiliary pulse to charge the capacitance associated with the load. The diode isolates the auxiliary pulse transformer from the main pulse. By charging the capacitance in this manner, a rise time of the main pulse is shortened and ringing of the main pulse on the load is reduced.

15 Claims, 4 Drawing Sheets

CIRCUIT FOR COMPENSATING RISE TIMES AND RINGING IN HIGH IMPEDANCE LOADS

CROSS-REFERENCE TO RELATED APPLICATIONS

Not Applicable.

BACKGROUND OF THE INVENTION

1. The Field of the Invention

The present invention relates to systems and methods for pulsing a high impedance load. More particularly, the present invention relates to systems and methods for compensating the rise times and ringing or overshoot responses associated with pulsed high impedance loads.

2. Background and Relevant Art

Pulse generators are devices that are used, for example, to generate an energy pulse that is delivered or applied to a load. Pulse generators deliver an energy pulse to loads such as, for example, spectrometers, accelerators, radar transmitters, high impedance electron guns, klystrons, as well as other equipment that require high voltage pulses. In this type of equipment, the energy pulses generated by the pulse generators should be fast and powerful.

In order to reduce the voltages actually generated by the pulse generators, pulse transformers are used to deliver the energy pulse the loads. The pulse transformers have a turn ratio that can provide the voltages required by the load. In many situations, the voltage delivered to the load can be quite large. For example, a pulse transformer may be used to deliver a voltage on the order of 30 kV (kilovolt) to 100 kV. Typical high impedance loads range from 1500 ohms to 30 kilohms.

One problem associated with delivering a pulse to a high impedance load through a pulse transformer is that significant ringing may result in the waveform. The ringing is partially associated with the rise time. When a fast rise time is needed, the target voltage of the pulse is often overshot and ringing results as the circuitry attempts to compensate. In other words, high impedance loads that are driven through a pulse transformer often experience ringing when trying to achieve fast rise times.

Another reason that makes it difficult to shorten rise times and reduce ringing is related to stray capacitance associated with the load. Stray capacitance adversely affects the rise time of the pulse on the load. As the stray capacitance increases, the rise time increases. The impedance of the load in combination with the stray capacitance can thus affect the ability of a pulse transformer based system to generate pulses that have a sufficiently fast rise time and minimal ringing.

BRIEF SUMMARY OF THE INVENTION

These and other limitations are overcome by embodiments of the present invention, which relates to systems and methods for delivering a pulse to a high impedance load. Embodiments of the present invention are able to improve rise times and at the same time reduce ringing associated with pulsing high impedance loads.

High impedance loads are often associated with a stray capacitance that can adversely affect the rise time and ringing of a pulse. One embodiment of the invention generates an auxiliary pulse that charges the stray capacitance of the load. When the main pulse is delivered to the load, the effect of the stray capacitance is reduced or eliminated because the capacitance has been charged by the auxiliary pulse. As a result, the rise time of the main pulse decreases and ringing is reduced.

In one embodiment, the load is connected to an auxiliary pulse generator through a diode and a pulse transformer. The auxiliary pulse generator delivers a pulse to the load before or at the beginning portion of the pulse delivered by the main pulse generator. The auxiliary pulse generator effectively charges or partially charges the capacitance related to the load and thereby reduces the effects of the capacitance on the pulse applied by the main pulse generator.

The pulse delivered by the auxiliary pulse generator can be adapted or adjusted to improve the rise time of the main pulse and/or reduce ringing. The duration of the auxiliary pulse, which is typically less than the duration of the pulse delivered by the main pulse generator can be adjusted. The magnitude of the auxiliary pulse can also be adjusted. The timing of the auxiliary pulse with respect to the main pulse can also be adjusted. Typically, the auxiliary pulse is delivered before the main pulse or at a beginning portion of the main pulse. Thus, the auxiliary pulse may or may not overlap with the main pulse.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention cam be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The present invention relates to systems and methods for delivering a high voltage pulse to a load and more particularly to circuits that both shorten the rise times of a pulse and reduce the ringing of the pulse on the load. Embodiments of the invention use an auxiliary pulse transformer to charge stray capacitance that is associated with the load being pulsed through a main pulse transformer. The stray capacitance is quickly charged by the auxiliary pulse and results in faster rise times for the main pulse and reduced or eliminated ringing when the main pulse is applied to the load.

Figure 1:
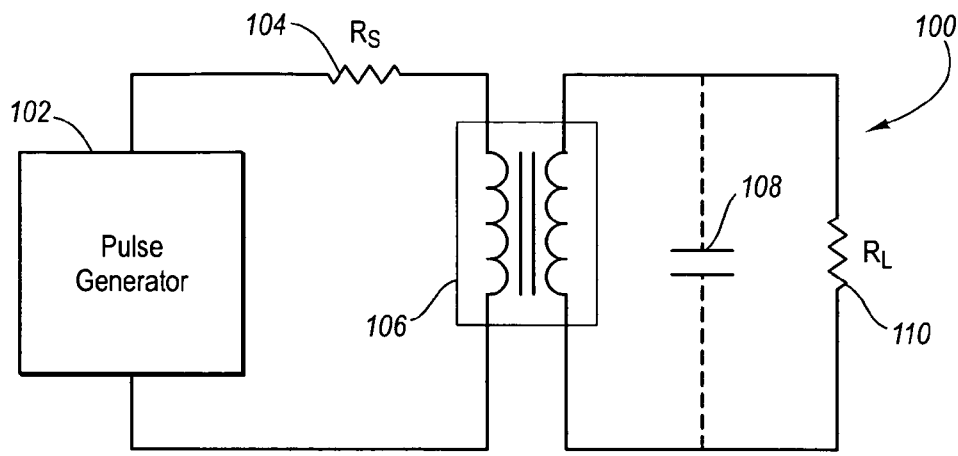
FIG. 1 illustrates a pulse generator that delivers a main pulse to a load through a pulse transformer and also illustrates capacitance related to the load.

FIG. 1 is a schematic diagram that illustrates one embodiment of a circuit for delivering a pulse to a load. In this example, a pulse generator 102 delivers a main pulse through the pulse transformer 106 to the load 110. The transformer 106 is a 1:N transformer and is typically configured to step up the voltage of the main pulse generated by the pulse generator 102. Thus, N is usually greater than 1. For example, the pulse generator 102 may generate a pulse on the order of 1 kilovolt that is transformed, when N=30, to 30 kV across the load. One of skill in the art can appreciate that other voltages, or turn ratios can be used to generate and deliver the main pulse to the load.

Figure 2:
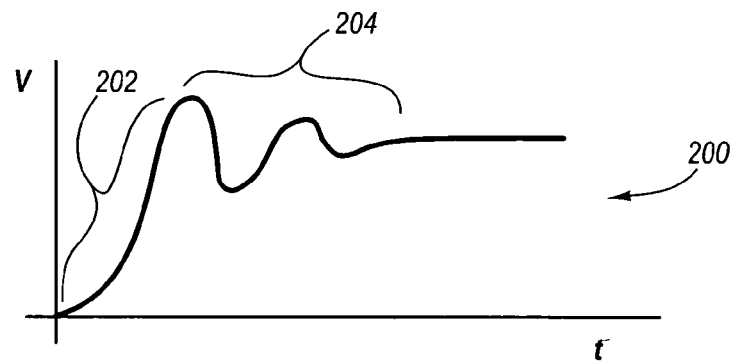
FIG. 2 illustrates the rise time and ringing on the waveform associated with the pulse delivered to the load in FIG. 1.

The capacitance 108 represents the stray capacitance associated with the load 110. As previously stated, loads are often associated with a stray capacitance that can adversely affect the rise time and/or the ringing associated with the pulse. The rise time and overshoot or ringing response associated with the load 110 is illustrated in FIG. 2. In FIG. 2, the portion 202 of the plot 200 represents a relatively slow rise time of the pulse on the load and the portion 204 of the plot 200 illustrates ringing that can occur on the load 110. Both of these characteristics are undesirable, particularly when the pulse duration of the main pulse is short.

Figure 3:
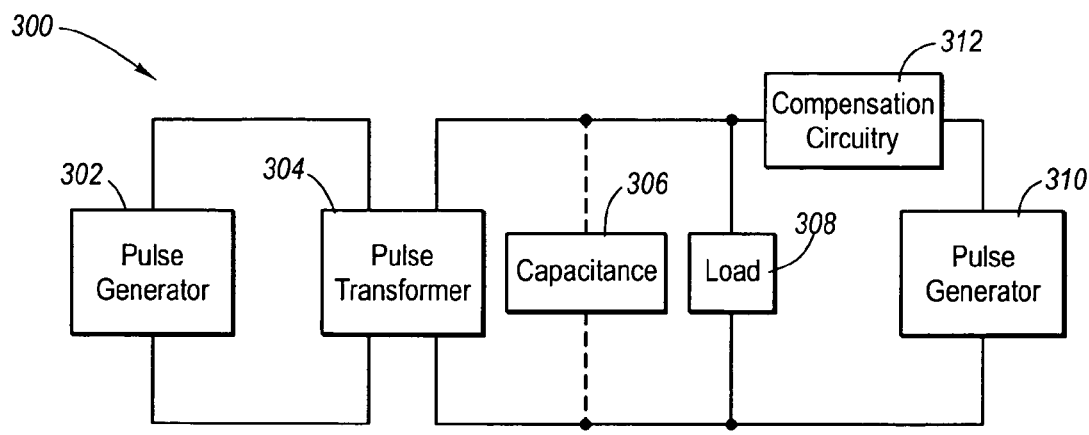
FIG. 3 illustrates one embodiment of compensation circuitry that improves the rise time of a main pulse and reduces or eliminates ringing on the waveform.

FIG. 3 illustrates an exemplary system that implements one embodiment of the present invention. FIG. 3 illustrates a pulse generator 302 that applies a pulse to a load 308 through a pulse transformer 304. The pulse generator 302 generates a main pulse that is used by the load for various functions related to the load. The pulse generator 302 and the pulse transformer 304 function similar to the system illustrated in FIG. 1. The capacitance 306 represents stray capacitance that is associated with or related to the load 306. As previously stated, the load may be a spectrometer, an accelerator, a radar transmitter, a high impedance electron guns, a klystron, and the like.

Effects associated with the stray capacitance 306, such as slower rise times and ringing on the waveform, are reduced or eliminated by the compensation circuitry 312. In FIG. 3, an auxiliary pulse, generated by the pulse generator 310, is applied through the compensation circuitry 312. The auxiliary pulse charges the capacitance 306 such that the rise time of the pulse delivered by the pulse generator 302 shortens and the ringing of the main pulse is reduced. In addition, the compensation circuitry 312 provides isolation from the main pulse delivered by the pulse generator 302 such that the load 308 is pulsed effectively and is not adversely affected by the compensation circuitry 312 or the auxiliary pulse generator 310.

Figure 4:
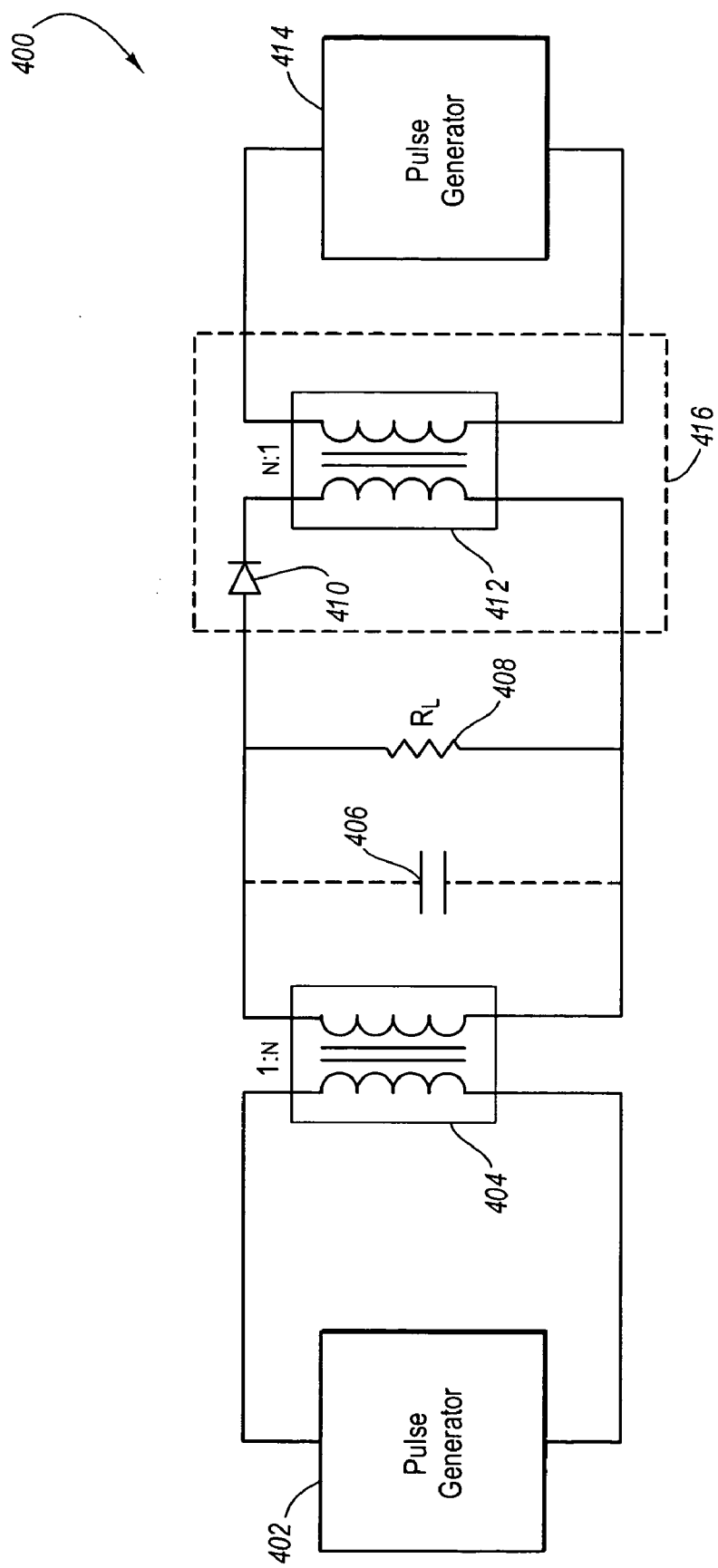
FIG. 4 illustrate an exemplary schematic of compensation circuitry that includes an auxiliary pulse transformer that is used to deliver a pulse to charge the capacitance associated with the load being pulsed.

FIG. 4 is a schematic diagram that further illustrates one embodiment of the present invention. FIG. 4 illustrates an example of the compensation circuitry 416, which includes a pulse transformer 412 and a diode 410. The pulse generator 414 generates an auxiliary pulse that charges the stray capacitance 406 associated with the load 408. Once the capacitance 406 is charged (or partially charged) the pulse generator 402 then delivers a main pulse to the load 408 through the pulse transformer 404. Because the capacitance 406 has been at least partially charged by the auxiliary pulse generated by the pulse generator 414, the load 408 experiences a faster rise time and less ringing.

Figure 5A:
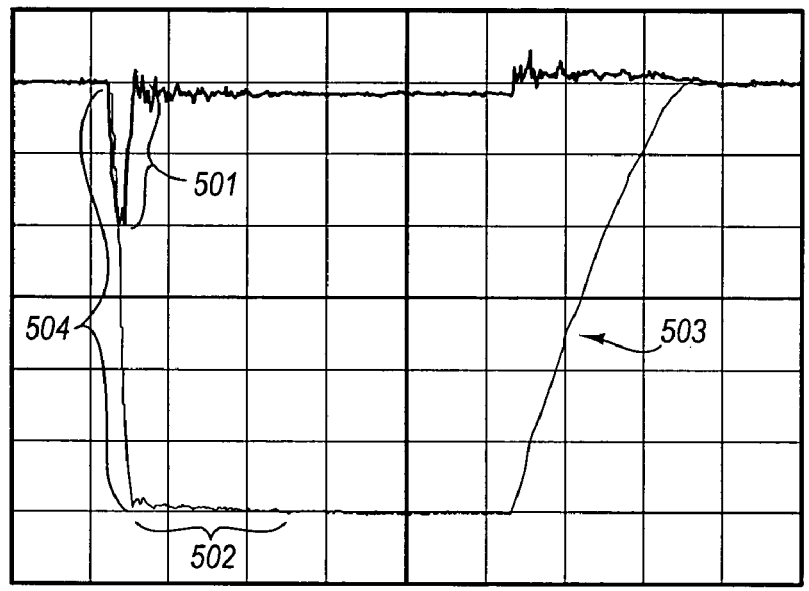
FIG. 5A illustrates an example of a waveform associated with a load when both a main pulse and an auxiliary pulse are delivered.
Figure 5B:
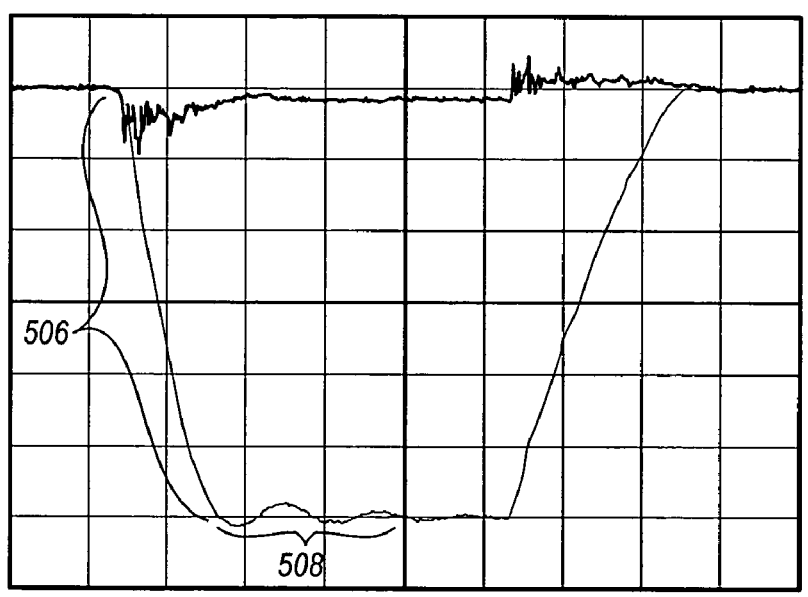
FIG. 5B illustrates an example of a waveform associated with a load when only a main pulse is delivered.

FIG. 5A illustrates an exemplary waveform resulting when a main pulse and an auxiliary pulse are applied to a load on the order of 50 kilohms that is associated with a stray capacitance on the order of 50 picofarads. FIG. 5B illustrates an exemplary waveform resulting when only a main pulse is applied to the same load and stray capacitance. One of skill in the art, however, can appreciate that this example is not limiting and that embodiments of the present invention can be applied to various other loads and associated stray capacitances. The load, for example, can be greater or less than 50 kilohms and the associated capacitance can also be more or less than 50 picofarads.

FIG. 5A illustrates an example where the auxiliary pulse 501 has been generated by the auxiliary pulse generator and applied to the load through an auxiliary pulse transformer. The duration of the auxiliary pulse 501 is less than the duration of the pulse 505 and functions to at least charge or partially charge the stray capacitance associated with the load. In contrast, FIG. 5B illustrates an example where the auxiliary pulse illustrated in FIG. 5A is not applied to the load.

Together, FIGS. 5A and 5B illustrate several benefits of the auxiliary pulse. The rise time 504 in FIG. 5A is faster than the rise time 506 illustrated in FIG. 5B. In addition, the ringing 502 on the waveform shown in FIG. 5A is less than the ringing 508 on the waveform illustrated in FIG. 5B.

The timing of the main pulse with respect to the auxiliary pulse can also vary. With further reference to FIGS. 4, 5A, and 5B, the main pulse delivered through the pulse transformer 404 and the auxiliary pulse delivered through the auxiliary pulse transformer 412 begin at substantially the same instant in time in this example. One of skill in the art can appreciate however, that the auxiliary pulse delivered to the load 408 through the auxiliary transformer 412 can begin before the main pulse or after the beginning of the main pulse. In addition, the auxiliary pulse may end before the main pulse begins in another embodiment. Usually, the auxiliary pulse overlaps a beginning portion of the main pulse. The timing of the auxiliary pulse can be controlled by a computer or other control circuitry or by setting a delay in the auxiliary pulse transformer. In each situation where the timing of the auxiliary pulse is changed, however, the rise time may also be changed.

In addition, FIGS. 5A and 5B illustrate that the length of the auxiliary pulse is short in comparison to the length of the main pulse even though the duration of the main pulse may be measured, for example, in the microsecond range. An exemplary purpose of the auxiliary pulse, as stated, is to charge the stray capacitance such that the main pulse has a fast rise time and reduced ringing.

Because the auxiliary pulse has an impact on the rise time of the main pulse and on the overshoot or ringing response of the main pulse, the auxiliary pulse can be adjusted to maximize the rise time and/or reduce ringing of the pulse. The auxiliary pulse can be adjusted, as discussed above, by controlling the timing and/or the duration of the auxiliary pulse.

The auxiliary pulse can further be adjusted by controlling the magnitude of the auxiliary pulse. The magnitude of the auxiliary pulse applied to the load can be varied, for example, by controlling the turn ratio in the windings of the auxiliary pulse transformer or by changing the magnitude of the pulse generated by the auxiliary pulse generator.

Thus, the turn ratio of the auxiliary pulse transformer, the duration of the auxiliary pulse, the timing of the auxiliary pulse, can all be adjusted to, in one embodiment, minimize or shorten the rise time and reduce ringing or overshoot. These characteristics of the auxiliary pulse can be controlled, in one embodiment, by adjusting the auxiliary pulse generator and/or the auxiliary pulse transformer or through signals that control the auxiliary pulse transformer. The optimum characteristics of the auxiliary pulse duration may be determined empirically for a given load, especially if the stray capacitance is unknown.

Figure 6:
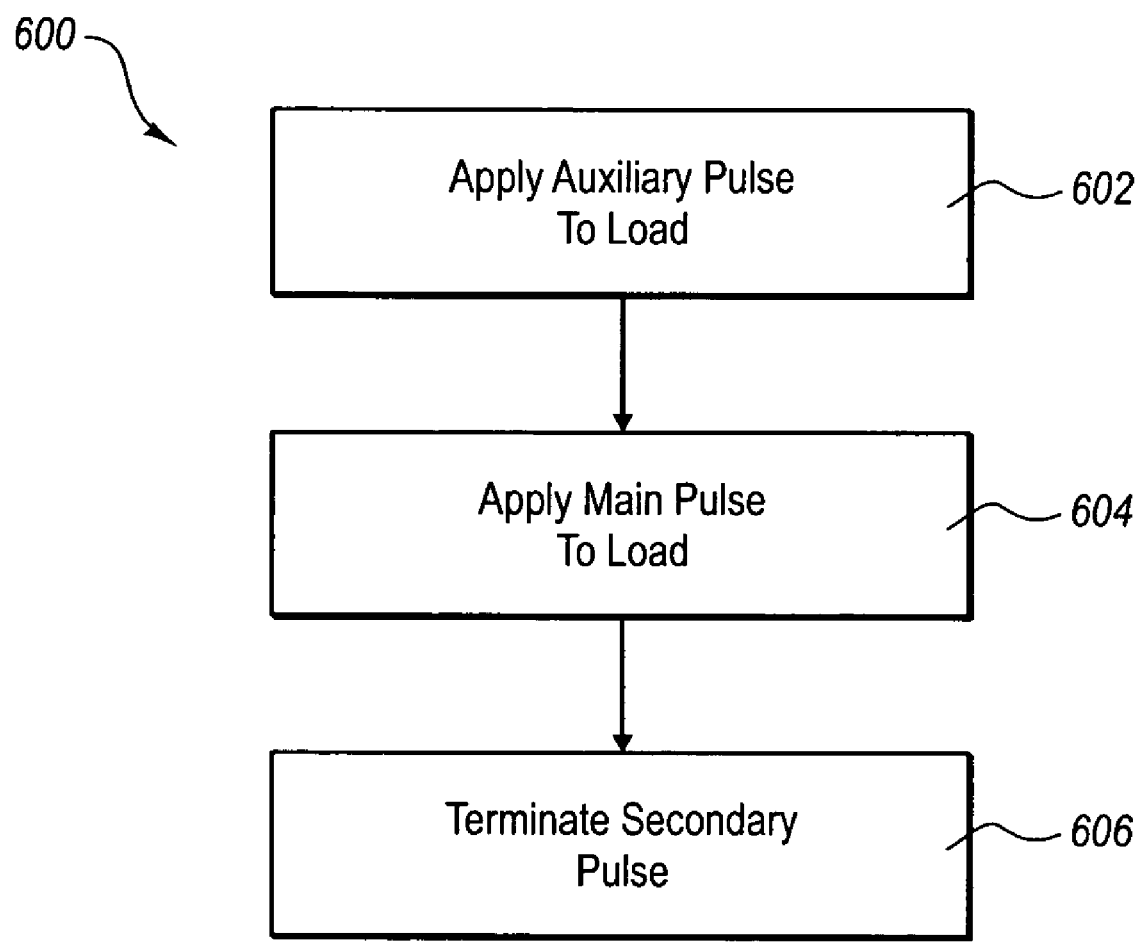
FIG. 6 illustrates an exemplary method for using an auxiliary pulse transformer to increase the rise time of a main pulse and/or reduce the ringing of the main pulse delivered to a load through a main pulse generator.

FIG. 6 illustrates an exemplary method for applying a pulse to a waveform such that the rise time is shortened and ringing on the waveform is reduced. An auxiliary pulse is generated and applied 602 to a load. One purpose of the auxiliary pulse is to charge the secondary capacitance associated with the load. The auxiliary pulse is applied through a pulse transformer and a diode.

Next, a main pulse is applied 604 to the load. Because the stray capacitance is charged by the auxiliary pulse, the main pulse has a faster rise time and ringing in the pulse, as represented in the waveform of the pulse on the load, may also be reduced. Then, the auxiliary pulse is terminated 606 while the main pulse continues until it is also terminated. The auxiliary pulse is typically only needed during a first portion of the main pulse. After that time, the auxiliary pulse is no longer needed as the main pulse is established and effects of the stray capacitance have been reduced by the auxiliary pulse. Although this example assumes that the auxiliary pulse begins before the main pulse and overlaps at least a first portion of the main pulse, the relative beginning points of the two pulses can vary as previously described.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. In a system that delivers a main pulse to a load, a circuit for shortening a rise time of the main pulse delivered to the load, the circuit comprising:
   a main pulse transformer coupled to a load, the main pulse transformer configured to deliver a main pulse to the load, wherein a rise time of the main pulse is related to a capacitance associated with the load;
   an auxiliary pulse transformer coupled to the load, wherein the auxiliary pulse transformer delivers an auxiliary pulse to charge the capacitance associated with the load; and
   a diode connected between the auxiliary pulse transformer and the main pulse transformer to isolate the auxiliary pulse transformer from the main pulse.

2. A circuit as in claim 1, further comprising a main pulse generator that generates the main pulse delivered to the load through the main pulse transformer.

3. A circuit as in claim 1, further comprising an auxiliary pulse generator that generates the auxiliary pulse delivered through the auxiliary pulse transformer.

4. A circuit as in claim 1, the main pulse having a duration that is longer than the duration of the auxiliary pulse.

5. A circuit as in claim 4, the auxiliary pulse being delivered through the auxiliary pulse transformer before the main pulse is delivered to the load through the main pulse transformer.

6. A circuit as in claim 4, the auxiliary pulse being delivered through the auxiliary pulse transformer such that the auxiliary pulse overlaps a first portion of the main pulse.

7. A circuit as in claim 4, the auxiliary pulse being delivered through the auxiliary pulse transformer to charge the capacitance to increase a rise time of the main pulse across the load.

8. A circuit as in claim 7, the auxiliary pulse being configured to reduce ringing of the main pulse on the load.

9. A circuit as in claim 7, further comprising means for adjusting the auxiliary pulse to minimize a rise time of the main pulse.

10. A method for decreasing a rise time of a main pulse delivered to a load through a main pulse transformer, the method comprising:
    applying an auxiliary pulse to a load through an auxiliary pulse transformer such that the auxiliary pulse charges a stray capacitance associated with the load;
    applying a main pulse to the load through a main pulse transformer, the main pulse having a rise time that is related to the stray capacitance, wherein the second pulse reduces the rise time; and
    terminating the auxiliary pulse after the stray capacitance associated with the load is charged.

11. A method as defined in claim 10, wherein applying an auxiliary pulse further comprises applying the auxiliary pulse such that the auxiliary pulse overlaps with a beginning portion of the main pulse.

12. A method as defined in claim 10, wherein applying an auxiliary pulse further comprises applying the auxiliary pulse such that the auxiliary pulse does not overlap with the main pulse.

13. A method as defined in claim 10, wherein applying an auxiliary pulse further comprises isolating the auxiliary pulse transformer from the main pulse.

14. A method as defined in claim 10, further comprising adjusting at least one of a timing, an amplitude, and a duration of the auxiliary pulse to reduce a rise time of the main pulse.

15. A method as defined in claim 10, further comprising adjusting at least one of a timing, an amplitude, and a duration of the auxiliary pulse to reduce a ringing of the main pulse on the load.

* * * * *